Dec. 6, 1955 W. S. WINFIELD 2,726,326

ELECTRICAL AUTOMATIC TUNING UNIT

Original Filed Oct. 29, 1942 2 Sheets-Sheet 1

INVENTOR.
William S. Winfield
BY John A. Harvey
ATTORNEY

INVENTOR.
William S. Winfield
BY John A. Harvey
ATTORNEY

United States Patent Office 2,726,326

Patented Dec. 6, 1955

2,726,326

ELECTRICAL AUTOMATIC TUNING UNIT

William S. Winfield, Kirkville, N. Y., assignor, by mesne assignments, to Sylvania Electric Products, Inc., New York, N. Y., a corporation of Massachusetts

Original application October 29, 1942, Serial No. 463,775, now Patent No. 2,524,281, dated October 3, 1950. Divided and this application May 27, 1949, Serial No. 95,697

6 Claims. (Cl. 250—20)

The present application is a division of application Serial No. 463,775, filed October 29, 1942, entitled Electrical Automatic Tuning Unit, now U. S. Patent 2,524,281 granted October 3, 1950, and assigned to the same assignee as the present application.

The present invention relates to automatic tuning of electrical circuits and has particular application to automatic tuning of radio apparatus such as transmitters and receivers. It is of particular utility in providing automatic tuning of aircraft radio apparatus, although it will be understood that it may be applied advantageously in many other installations where automatic tuning is desirable.

Various proposals have been made in the past for providing automatic tuning, of the motor driven type. In most of these, some mechanical element was adjusted so as to stop the operation of the tuning instrumentality when a particular dial setting corresponding to that of the desired frequency was reached. This involved not only the necessity of careful adjustment of the mechanical elements, in setting up the apparatus initially, but also careful checking and maintenance to make sure that mechanical misadjustments or misalignments did not throw one or more circuits off tune. Apparatus of this type usually was complicated and required considerable time to adjust and maintain, and the results were not too satisfactory at best.

In accordance with this invention, I provide a purely electrically controlled tuner, preferably using crystal oscillators or other master oscillators, the frequencies of which are set by the frequency determining element, such as the crystal. In most applications of my invention there will be provided several frequency fixing elements. For instance, if a transmitter or receiver is designed to operate on one of six channels, I may provide a multiple crystal oscillator arranged to receive six crystals, each chosen to provide one of the frequencies desired, and some form of selecting switch so that the operator may select the channel to which he wishes to tune. A variable tuning instrument, such as a gang condenser or gang variometer, may be provided for tuning all of the circuits required to be tuned, and power means, such as a motor, may be provided to operate the tuner.

In accordance with my invention, some circuit which is variably tuned is established as the controlling circuit and a determination may be made of the current output from this circuit which constitutes desired operation, I provide a relay operatively associated with this circuit, controlling the variation of the tuning instrumentality to stop the movement thereof when the desired energy level is being delivered from the controlling circuit. In operation, the operator has only to operate a switch for the channel desired, whereupon the motor will be set into operation, the tuning of the apparatus will be varied until it is tuned to the desired frequency and is delivering the desired output energy, at which point, without any further action by the operator, the movement of the tuning instrumentality is stopped, and the apparatus remains tuned to the desired channel.

Among the objects of my invention may be mentioned:

To provide automatic tuning apparatus in which no adjustment is required to recalibrate the apparatus for new frequency channels.

To provide automatic tuning apparatus which is simple, positive, and reliable in operation.

To provide automatic tuning apparatus which is free from mechanical selector parts requiring close adjustment and careful maintenance.

To provide automatic tuning apparatus which may be incorporated in radio receivers and transmitters by the addition of a relatively small number of parts of little weight, small bulk, and requiring little in the way of maintenance.

Still other objects of my invention will be apparent from the specification.

Figures 1, 2:
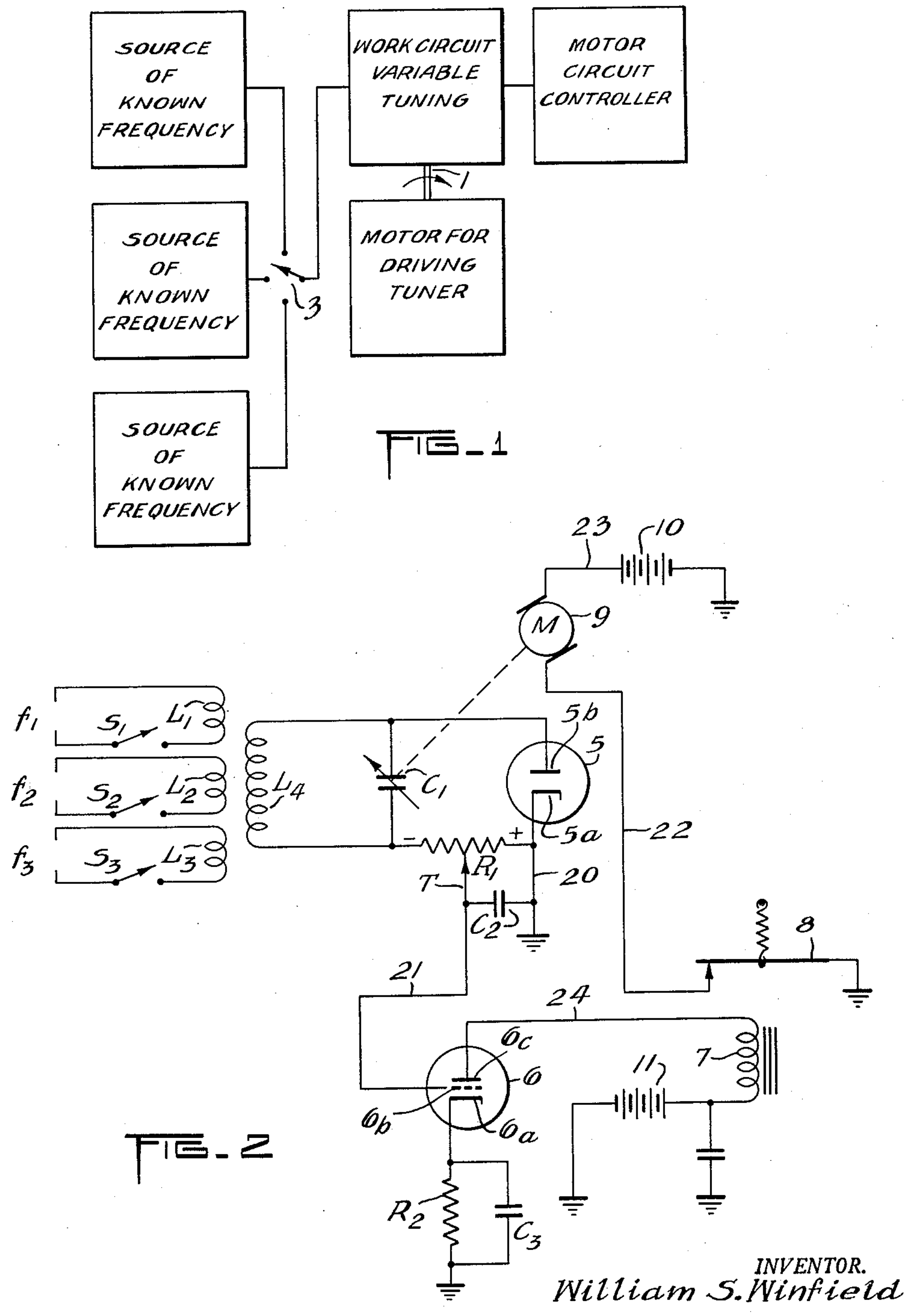
Fig. 1 is a block diagram illustrating the principles of my invention.
Fig. 2 is a simplified circuit diagram illustrating the application of my invention to provide automatic tuning over three channels in a single tuned circuit.

Referring now more particularly to Fig. 1, I have shown three separate sources of known frequency. These may, for example, be piezoelectric crystals, one crystal, for example, oscillating on a first frequency, the second crystal on a second frequency, and the third on a third frequency. While these sources may be crystals, they may be oscillators of other types oscillating on a fixed and invariable frequency.

These are associated with a work circuit having variable tuning, and a switch 3 may be provided for selectively connecting any desired frequency source to the work circuit. The work circuit is provided with a variable tuning element, such as a variable condenser or variometer, arranged to be driven by a suitable motor through shaft 1. Preferably the variable tuning element is arranged for continuous variation in one direction, and will continuously traverse the entire tuning range of the circuit. The work circuit is of the type which will not deliver output until it is excited by a source, and when so excited, delivers oscillations of only the source frequency. A motor circuit controller is associated with the output of the work circuit so that when a predetermined level of energy is delivered by the work circuit, the motor circuit controller operates to stop the movement of the variable tuning element.

Thus the operator, in case he wishes the circuit to operate on frequency F1, will set the switch 3 for the particular frequency, whereupon, if the circuit is not tuned to that frequency, the motor will begin to drive the tuning element. No output will be delivered by the work circuit until the variable tuning element reaches such a position that the work circuit is tuned to the selected frequency. When this position is reached, the work circuit begins to deliver energy and if this energy is equal to the predetermined value, the motor circuit controller operates and stops the movement of the tuner, and the circuit will remain tuned at the desired frequency as long as it continues to deliver the desired amount of energy, or until the operator moves the switch 3 to select a different frequency, whereupon the circuit will be tuned to the new frequency as above described. In case it is desired to recalibrate the apparatus for a new frequency or frequencies within the range of the apparatus, it is only necessary to remove the crystals from their sockets and insert a different crystal or crystals, of the frequency or frequencies desired. The time-consuming operation of recalibration, which formerly required a skilled operator and complicated test equipment, is entirely eliminated.

Referring now more particularly to Fig. 2, this is a circuit diagram showing the invention applied to tuning a single circuit, which may be any circuit desired. It may, for example, be an antenna circuit of a transmitter or receiver. In this instance *f*1, *f*2, and *f*3 indicate sources of oscillations of three different frequencies. These sources may be crystals or other suitable and well-known elements. Each may be coupled to the tuned circuit through coils L1, L2, and L3 respectively by the closure of the respective switches S1, S2, and S3. The tuned circuit may comprise the inductance L4 tuned by condenser C1.

Parallel with condenser C1 I may provide a diode 5 having cathode *5a* and anode *5b*. Resistance R1 may be interposed between the cathode lead 20 and the connection to the condenser C1. Adjustable tap T may be provided to connect to any desired point on the resistance R1 and by-pass condenser C2 may be connected from this tap to the cathode lead 20, which may be grounded as indicated. Control tube 6 may comprise cathode *6a*, control electrode *6b* and anode *6c*, and the cathode may be connected to ground through resistance R2 shunted by condenser C3 and the tap T may be connected to the control electrode *6b* by lead 21.

Plate voltage may be supplied through lead 24 by a suitable source 11 through relay winding 7, which may serve, when energized, to keep the relay armature 8 in closed position against a suitable bias. The relay armature 8 completes the circuit of the motor 9 through leads 22 and 23 and a suitable power source 10. The motor 9 in turn is connected mechanically as indicated by the dotted line, to operate the variable condenser C1, which is preferably arranged to admit of continuous rotation through any number of complete revolutions. Preferably, but not necessarily, a clutch of any desired type may be incorporated in the motor 9 so that when the motor circuit is opened, the motor is disconnected from the condenser shaft. The value of resistances R2 and R1, and the amount of the plate voltage applied to tube 6 is preferably so chosen that when no current is flowing in the circuit L4—C1, the space current of tube 6 is sufficient to maintain relay armature 8 in circuit closing position against its bias, and the value of resistance R1 is so chosen that the rectified current flowing therein through the diode 5 is sufficient to bias the tube 6 to cut-off, or to reduce the plate current sufficiently to permit the armature 8 to be opened.

By adjustment of the tap T on the proper point of R1, the action of the circuit can be very precisely controlled, movement of the tap to the left causing plate current cut-off at a lower current and movement to the right increasing the amount of current required to effect cut-off. The operation of this circuit, it is believed, will be clear from what has already been said.

If the operator wishes the circuit to be tuned to frequency F1, assuming the apparatus is in operating condition (the necessary "on" and "off" switches, not shown, having been placed in condition for operation), he will close switch S1. If the circuit is not tuned to the desired frequency, no current will be generated in the circuit L4—C1, no bias other than the normal bias will be applied to the tube 6, plate current will flow, the armature 8 will be closed, the motor circuit will be energized, and the motor will drive tuning condenser C1.

When the circuit comes into tune with frequency F1, current of this frequency will begin to flow, building up a unidirectional potential across resistance R1, having the polarity indicated. When this reaches a value sufficient to cut off plate current in the tube 6, the armature 8 will be opened and the circuit will remain in tune as long as the current flow is sufficient to maintain the cut-off bias on tube 6. Should the operator desire to change to another channel, he will open switch S1 and close switch S2 or switch S3, as the case may be, and the operation will be as before described, the circuit being tuned to the new frequency.

Figure 3:
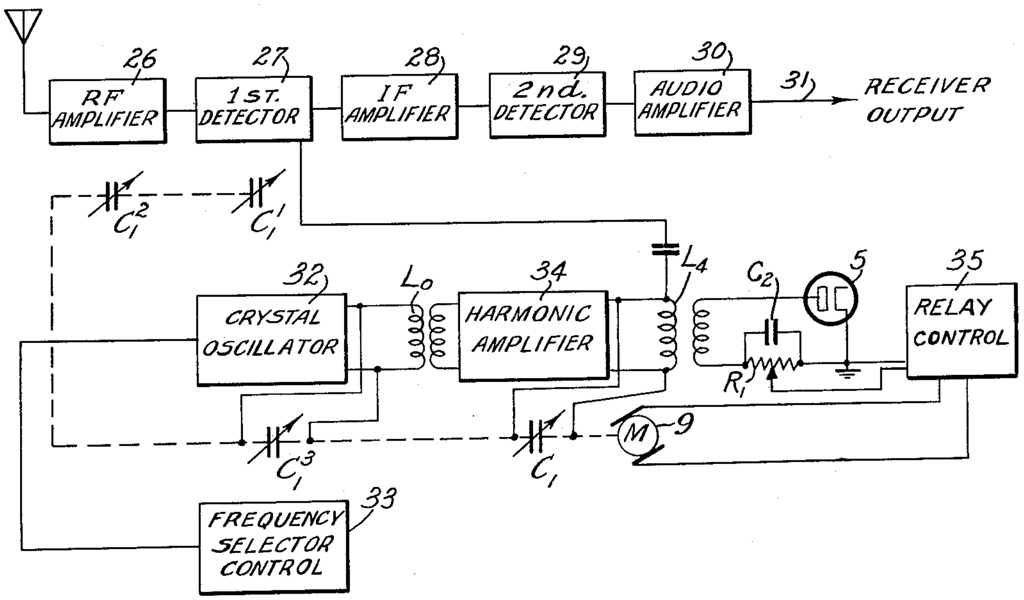
Fig. 3 is a similar diagram showing the application of the invention to a radio receiver.

Referring now more particularly to Fig. 3, I have shown my invention as applied to a receiver of the well-known superheterodyne type comprising a radio frequency amplifier 26, first detector 27, intermediate frequency amplifier 28, second detector 29, audio-amplifier 30, and output circuit 31 of any suitable type to render the signal intelligible. In this instance, as before, there may be provided a crystal oscillator 32 or other suitable oscillator or oscillators of constant frequency provided with a frequency selective control 33 which as explained above may be comprised by crystals selectively switched manually into the input circuit of the oscillator 32 in conventional manner and by means of which the operator can select the oscillator frequency and thereby tune to the desired channel. The oscillator is conventional and may include an output tuned circuit comprised by an inductor L0 tuned to the selected crystal frequency by a condenser $C1^3$ and inductively coupled to the input circuit of an amplifier, which in the case of an ultra-high frequency receiver may be a harmonic amplifier or frequency multiplier 34. The output of the amplifier 34 is tuned to a harmonic of the applied oscillator frequency and is comprised by the inductor L4 tuned by the condenser C1. It is coupled to the first detector 27 as indicated. The detector 27 operates in conventional manner to modulate the harmonic oscillations supplied to it from the amplifier 34 with the amplified signal translated to the detector through the amplifier 26, and the modulation components of intermediate frequency are applied to the intermediate frequency amplifier 28 for further amplification therein. A portion of the output from the oscillator 32, before or after passing through the amplifier 34, may be supplied to the tuning control system including the diode rectifier 5 and diode load impedance R1C2, and the control voltage developed across the latter is applied to the relay control 35 which may include the elements 6, 7, 8, 10, 11 and R2C3 of Fig. 2 connected in the circuit arrangement there shown. This relay control 35 controls the circuit of motor 9 driving the tuning instrumentality, which in this instance may be a gang variable condenser having a section $C1^2$ tuning the R. F. amplifier 26, $C1^1$ the first detector 27, $C1^3$ the crystal oscillator 32, and C1, the amplifier 34.

The operation of this circuit, insofar as the tuning control is concerned, is the same as those previously described. If the operator wishes to receive signals of frequency F1, he will operate the frequency selector control 33 to select this frequency. If the oscillator 32 is not tuned to the proper value to give beat frequencies corresponding to the desired channel, the circuit of motor 9 will be closed by the relay control 35, and the oscillator tuning will be varied by operation of the tuning condenser $C1^3$. At the same time the other circuits will be tuned by condensers C1, $C1^1$ and $C1^2$ to the proper values to correspond.

When the oscillator is tuned to the desired frequency, current begins to flow in the diode 5, and when this current reaches a predetermined value, the relay control stops the variation in tuning, and the receiver remains tuned to the desired channel until the operator manipulates the frequency selector control to set the receiver for a different channel.

In practical operation of apparatus according to my invention, it has been found desirable not to set the relay control for the maximum current that can be obtained under best conditions, because any slight loss of efficiency might cut down the current output to a value insufficient to operate the relay control, in which case the motor would continue to operate and the tuner would pass over the desired frequency. I prefer to set the relay control for a value sufficiently less than the maximum current to assure that there will always be sufficient current to operate the relay control. Also, it will be preferable to interpose a considerable mechanical step down ratio between the motor and the tuning shaft to prevent too fast operation of the tuning shaft and to prevent harmful overrun after the current has reached the value to operate the relay control.

In this application I have particularly pointed out and distinctly claimed the part, improvement, or combination which I claim as my invention or discovery, and I have explained the principles thereof and the best mode in which I have contemplated applying those principles, so as to distinguish my invention from other inventions.

While I have shown and described certain preferred embodiments of my invention, it will be understood that modifications and changes may be made without departing from the spirit and scope of my invention, as will be clear to those skilled in the art.

What is claimed is:

1. A superheterodyne type of wave signal receiver comprising, a first detector stage having first and second inputs, means for supplying a received wave signal to said first input of said first detector stage, an intermediate frequency signal channel connected to the output of said first detector stage, at least one tunable resonant circuit having a variable tuning element, a local source of oscillations, means for coupling a signal from said source to said second input of said first detector stage to convert a received wave signal supplied to said first detector stage into a corresponding intermediate frequency signal, means independent of said intermediate frequency signal channel for coupling a signal from said source to said resonant circuit to excite the same, motor means for tuning said first detector stage and for varying said tuning element, and a control system responsive to the level of energy developed in said resonant circuit by the excitation thereof from said source and independent of signals transmitted through said intermediate frequency signal channel for controlling said motor means to stop the variation of said tuning by said motor means in response to the development in said resonant circuit of a predetermined level of energy at a frequency determined by said source.

2. A superheterodyne type of wave signal received comprising, a first detector stage having first and second inputs, means for supplying a received wave signal to said first input of said first detector stage, an intermediate frequency signal channel connected to the output of said first detector stage, at least one tunable resonant circuit having a variable tuning element, a local source of oscillations, means for coupling a signal from said source to said second input of said first detector stage to convert a received wave signal supplied to said first detector stage into a corresponding intermediate frequency signal, means independent of said intermediate frequency signal channel for coupling a signal from said source to said resonant circuit to excite the same, motor means for tuning said first detector stage and for varying said tuning element, means independent of said intermediate frequency signal channel for deriving a control signal from said resonant circuit in response to excitation thereof by said source when said resonant circuit is tuned by said motor means to substantially the frequency of said source, and means responsive to said control signal for controlling said motor means to stop the tuning operation effected by said motor means.

3. A superheterodyne type of wave signal receiver comprising, a tunable wave signal transmission channel including frequency converter means provided with first and second inputs and an intermediate frequency amplifier coupled to said frequency converter means, means for supplying a received wave signal to said first input of said converter means, at least one tunable resonant circuit having a variable tuning element, a local source of oscillations, means for coupling a signal from said source to said second input of said converter means as a local oscillator signal so that said converter means converts a received wave signal supplied to said converter means into a corresponding intermediate frequency signal, means independent of said intermediate frequency amplifier for coupling a signal from said source to said resonant circuit to excite the same, motor means for tuning said channel and for varying said tuning element, and means independent of said intermediate frequency amplifier and controlled by the level of energy developed in said resonant circuit by said excitation for energizing said motor means to vary said tuning element and the tuning of said channel except during periods when said resonant circuit is tuned to substantially the frequency of said source.

4. A superheterodyne type of wave signal receiver as claimed in claim 1 wherein said local source of oscillations has a plurality of preselectable frequencies each controlled by piezoelectric means and means for selectively controlling said piezoelectric means to establish the frequency of said source.

5. A superheterodyne type of wave signal receiver as claimed in claim 1 which includes a rectifier system coupled to said resonant circuit to develop a unidirectional control potential, and said control system is responsive to said unidirectional control potential to control said motor means in accordance therewith.

6. A superheterodyne type of wave signal receiver as claimed in claim 1 wherein said source is coupled to said first detector stage through a tunable harmonic amplifier and said motor means is arranged to vary the tuning of said harmonic amplifier, the frequency of said source being selectable independently of said motor means and within a range of values which are integral submultiples of the tuning range of said amplifier.

References Cited in the file of this patent

UNITED STATES PATENTS

| | | |
|---|---|---|
| 1,792,276 | Chubb | Feb. 10, 1931 |
| 2,044,645 | Stapleton | June 16, 1936 |
| 2,056,200 | Lowell | Oct. 6, 1936 |
| 2,078,060 | Clement | Apr. 20, 1937 |
| 2,152,336 | Van Loon | Mar. 28, 1939 |
| 2,207,467 | Muller | July 9, 1940 |
| 2,247,455 | Turin et al. | July 1, 1941 |
| 2,320,996 | Alexanderson et al. | June 8, 1943 |
| 2,360,764 | Crosby | Oct. 17, 1944 |
| 2,404,101 | Schock | July 16, 1946 |
| 2,470,843 | Boothroyd et al. | May 24, 1949 |
| 2,478,977 | Nicholson | Aug. 16, 1949 |